United States Patent
Magoon et al.

(10) Patent No.: US 9,444,498 B2
(45) Date of Patent: *Sep. 13, 2016

(54) REPARTITIONED TRANSCEIVER USING SILICON-ON-INSULATOR

(71) Applicant: BROADCOM CORPORATION, Irvine, CA (US)

(72) Inventors: Rahul Magoon, Irvine, CA (US); Michael (Meng-An) Pan, Irvine, CA (US); Ahmad Mirzaei, Orlando, FL (US); Mohyee Mikhemar, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 403 days.

This patent is subject to a terminal disclaimer.

(21) Appl. No.: 13/718,378

(22) Filed: Dec. 18, 2012

(65) Prior Publication Data

US 2014/0153619 A1    Jun. 5, 2014

Related U.S. Application Data

(60) Provisional application No. 61/732,824, filed on Dec. 3, 2012.

(51) Int. Cl.
| | |
|---|---|
| *H04B 1/02* | (2006.01) |
| *H04B 1/04* | (2006.01) |
| *H03F 3/195* | (2006.01) |
| *H03F 3/24* | (2006.01) |
| *H03F 3/45* | (2006.01) |

(52) U.S. Cl.
CPC ............ *H04B 1/0458* (2013.01); *H03F 3/195* (2013.01); *H03F 3/245* (2013.01); *H03F 3/45475* (2013.01); *H03F 2203/45548* (2013.01)

(58) Field of Classification Search
USPC .................... 455/91–129; 375/295–315, 135
See application file for complete search history.

(56) References Cited

U.S. PATENT DOCUMENTS

| | | | | |
|---|---|---|---|---|
| 4,158,808 | A * | 6/1979 | Massa et al. ................... | 324/74 |
| 5,939,916 | A * | 8/1999 | Jamal et al. ................... | 327/231 |
| 7,602,227 | B2 * | 10/2009 | Kim et al. ..................... | 327/359 |
| 8,406,710 | B1 * | 3/2013 | Soe ......................... | H01Q 11/12 |
| | | | | 330/154 |
| 8,406,723 | B1 * | 3/2013 | Lobo et al. .................... | 455/307 |
| 9,041,472 | B2 * | 5/2015 | Chen ......................... | H03F 3/19 |
| | | | | 330/307 |
| 2004/0075500 | A1 * | 4/2004 | Inokuchi ....................... | 330/253 |
| 2004/0232988 | A1 * | 11/2004 | Nakatani et al. .............. | 330/252 |
| 2005/0134410 | A1 * | 6/2005 | Franca-Neto ................. | 333/247 |
| 2010/0201448 | A1 * | 8/2010 | Sasaki ........................ | 330/278 |
| 2010/0248660 | A1 * | 9/2010 | Bavisi .................. | H04B 1/0458 |
| | | | | 455/120 |
| 2011/0217940 | A1 * | 9/2011 | Oliaei ....................... | H03F 3/16 |
| | | | | 455/127.2 |

(Continued)

OTHER PUBLICATIONS

Tombak, Ali et al, "A Flip-Chip Silicon IPMOS Power Amplifier and a DC/DC Converter for GSM 850/900/1800/1900 MHz. Systems". In: IEEE RFIC Symposium, Jun. 3-5, 2007. pp. 79-82.*

(Continued)

*Primary Examiner* — Lana N Le
(74) *Attorney, Agent, or Firm* — McDermott Will & Emery LLP

(57) ABSTRACT

A transceiver circuit including a digital-to-analog converter, a filter coupled to the digital-to-analog converter, a passive mixer coupled to the filter, via a buffer and a multi-stage power amplifier coupled to the passive mixer via a passive amplifier. A transmitter and method for amplifying a RF signal for transmission are also provided.

15 Claims, 7 Drawing Sheets

(56) References Cited

U.S. PATENT DOCUMENTS

| | | | | |
|---|---|---|---|---|
| 2011/0260791 | A1* | 10/2011 | Acar et al. | 330/127 |
| 2012/0063496 | A1* | 3/2012 | Giannini et al. | 375/221 |
| 2013/0196611 | A1* | 8/2013 | Duez et al. | 455/326 |
| 2014/0128014 | A1* | 5/2014 | Mirzaei | H04B 1/0475 |
| | | | | 455/127.2 |
| 2014/0253340 | A1* | 9/2014 | Albert et al. | 340/692 |
| 2014/0349716 | A1* | 11/2014 | Axholt | 455/571 |
| 2015/0050901 | A1* | 2/2015 | Lee | H03F 1/0277 |
| | | | | 455/127.3 |

OTHER PUBLICATIONS

D'Souza, Sandeep et al, A Programmable Baseband Anti-Alias Filter for a Passive-Mixer-Based, SAW-less, Multi-Band, Multi-Mode Wedge Transmitter, May 15-18, 2011, 2011 IEEE International Symposium on Circuits and Systems (ISCAS), pp. 450-453, Rio de Janeiro, Brazil, ISBN: 978-1-4244-9473-6, DOI: 10.1109/ISCAS.2011.5937599.*

* cited by examiner

REPARTITIONED TRANSCEIVER USING SILICON-ON-INSULATOR

This application claims the benefit of U.S. Provisional Application No. 61/732,824, filed Dec. 3, 2012, entitled "REPARTITIONED TRANSCEIVER USING SILICON-ON-INSULATOR," which is incorporated herein by reference.

BACKGROUND

The subject technology relates to a transceiver, and particularly to a repartitioned transceiver front end in which power amplification is implemented using silicon-on-insulator.

Mobile devices, such as cell phones, include transceivers for transmitting and receiving radio frequency (RF) signals. The signal path of a transmitted signal can contain one or more power amplifiers embedded on separate chips or dies. In some implementations, the components used to construct a transmitter circuit may be provided by different vendors; accordingly, interfaces between components are often standardized to ensure the interchangeability of comparable parts received from different sources.

SUMMARY

The disclosed subject matter relates to a transceiver circuit. In certain aspects, the transceiver circuit can include a digital-to-analog converter, a filter coupled to the digital-to-analog converter and a passive mixer coupled to the filter, via a buffer. The transceiver circuit can further include a multi-stage power amplifier coupled to the passive mixer via a passive amplifier. In some implementations, the passive amplifier can comprise a LC circuit configured to generate a series LC resonance.

In another aspect, the disclosed subject matter also relates to a transmitter. In certain implementations, the transmitter includes a digital-to-analog converter, a filter coupled to the digital-to-analog converter and a passive mixer coupled to the filter, via a buffer, wherein the buffer comprises an inverter-based feedback amplifier. In some implementations, the transmitter further includes a multi-stage power amplifier coupled to the passive mixer via a passive amplifier.

In yet another aspect, the disclosed subject matter also relates to a process for amplifying a RF signal for transmission. In certain implementations, the process can include converting a digital signal into an analog signal, using a digital to analog converter, filtering the analog signal, using a low-pass filter, and mixing, using one or more mixers, the analog signal with a local oscillator signal to produce a modulated RF signal. In certain aspects, the process can include inputting the modulated RF signal to a passive amplifier, wherein an output of the passive amplifier is coupled to a multi-stage power amplifier via an interface.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, without departing from the scope of the subject technology. Accordingly, the drawings and detailed description are to be regarded as illustrative, and not restrictive in nature.

BRIEF DESCRIPTION OF THE DRAWINGS

Certain features of the subject technology are set forth in the appended claims. The accompanying drawings, which are included to provide further understanding, illustrate disclosed aspects and together with the description serve to explain the principles of the disclosed aspects. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. It will be clear and apparent to those skilled in the art that the subject technology is not limited to the specific details set forth herein and may be practiced without these specific details. In some instances, structures and components are shown in block diagram form in order to avoid obscuring the concepts of the subject technology.

Figure 1:
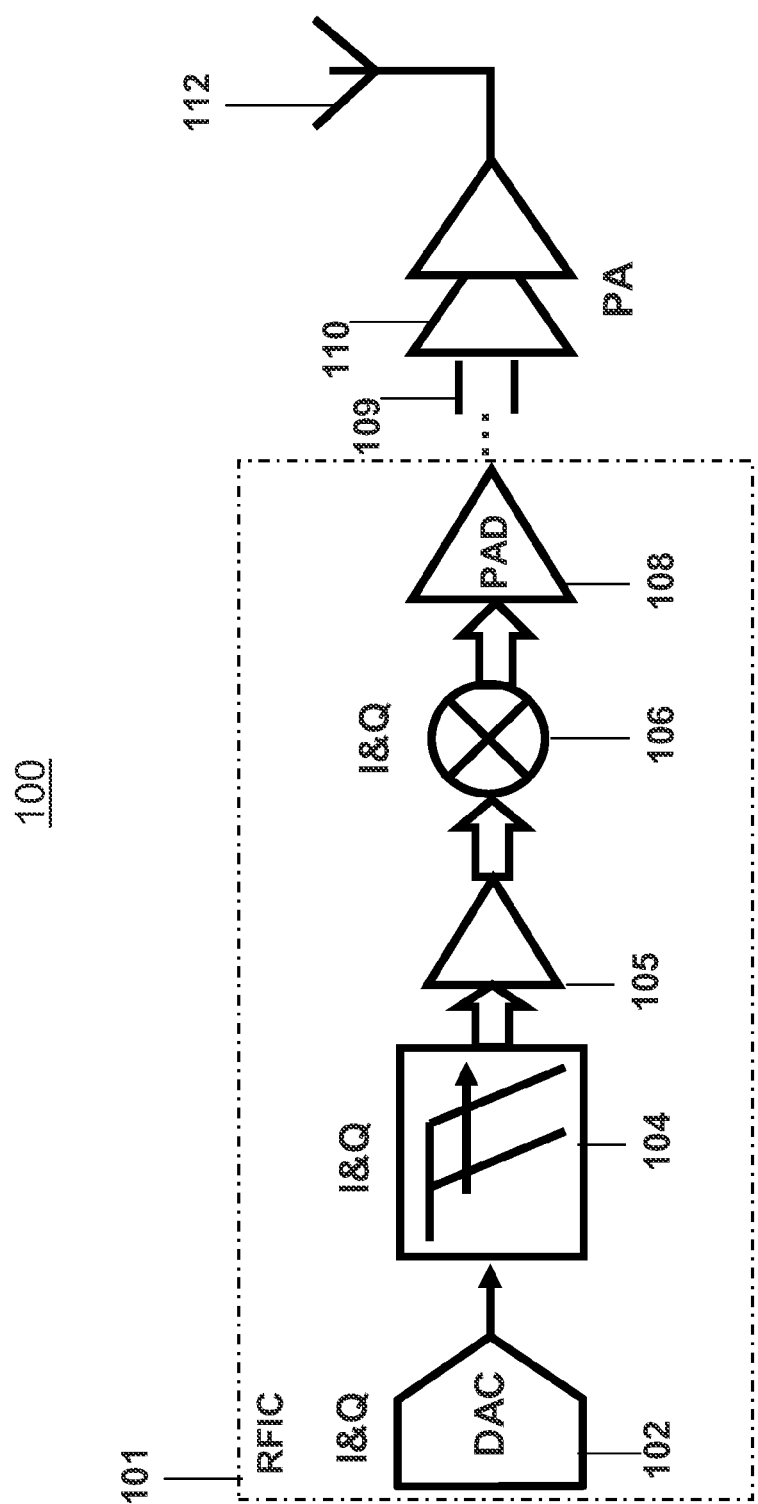
FIG. 1 illustrates an example of a conventional transceiver front end architecture, including a power amplifier driver and a power amplifier interface.

FIG. 1 illustrates an example of a conventional transceiver front end 100. Transceiver front end 100 can be used to send and receive radio frequency (RF) signals, for example, for use in a mobile device such as a cell phone. Transceiver front end 100 includes a radio frequency integrated circuit (RFIC) 101 that includes digital to analog converter (DAC) 102, filter 104, buffer 105, mixer 106 and power amplifier driver (PAD) 108. As illustrated, transceiver front end further includes interface 109, power amplifier (PA) 110, and antenna 112.

In the implementation depicted in FIG. 1, it is understood that transceiver front end 100 can represent a differential transceiver architecture for carrying in-phase signals (I) and quadrature phase signals (Q). As such, transceiver front end 100 can include multiple DACs, filters, mixers and/or PADs, for carrying I and Q signals on separate signal paths.

In transceiver front end 100, DAC 102 is coupled to filter 104, which is coupled to mixer 106, via buffer 105. In turn, mixer 106 is coupled to an input of PAD 108 and an output of PAD 108 is coupled to an input of PA 110, via interface 109. Furthermore, an output of PA 110 is coupled to antenna 112. By way of example, an analog RF signal can be prepared for transmission by first being provided to DAC 102 on RFIC 101, converted to a digital signal at the output of DAC 102, and then provided to filter 104. Filter 104 can comprise a low-pass filter for removing high frequency components of the digital RF signal. The filtered signal can then be provided to mixer 106, via buffer 105. A buffer stage, such as that provided by buffer 105, may be required to provide a lower output resistance/impedance (e.g., a lower $R_{OUT}$) to drive a passive mixer (e.g., mixer 106). At mixer 106, I and Q modulation are performed on the signal and it is outputted to PAD 108.

Depending on implementation, DAC 102, filter 104, mixer 106 and PAD 108 may be integrated onto a single chip or die (e.g., RFIC 101), as shown in FIG. 1. The components integrated onto RFIC 101 can be implemented using system-on-chip (SOC) and configured to provide a standardized PAD output, for example, to enable the interchangeability off-chip components. Off-chip component parts, such as PA 110, may be supplied by various third-party vendors and implemented using gallium arsenide (GaAs). To facilitate the interchangeability of off-chip components, RFIC 101 and particularly PAD 108 can be configured to operate with an interface (e.g., interface 109) having a standardized impedance. By way of example, PAD 108 can be configured to couple with interface 109 having an impedance between 45 and 55 ohms. In certain implementations, PAD 108 may be configured to drive an interface (e.g., interface 109) having an impedance of about 50 ohms.

Although GaAs implementations are generally more efficient than SOI (for example using CMOS), the overall power characteristics of a transceiver front end can be improved if power amplification components are repartitioned and implemented using SOI. As will be discussed in further detail below, the overall power efficiency of the transceiver front end can be improved by eliminating the need for a power amplifier driver (e.g., PAD 108) and off-chip interface (e.g., interface 109).

Figure 2:
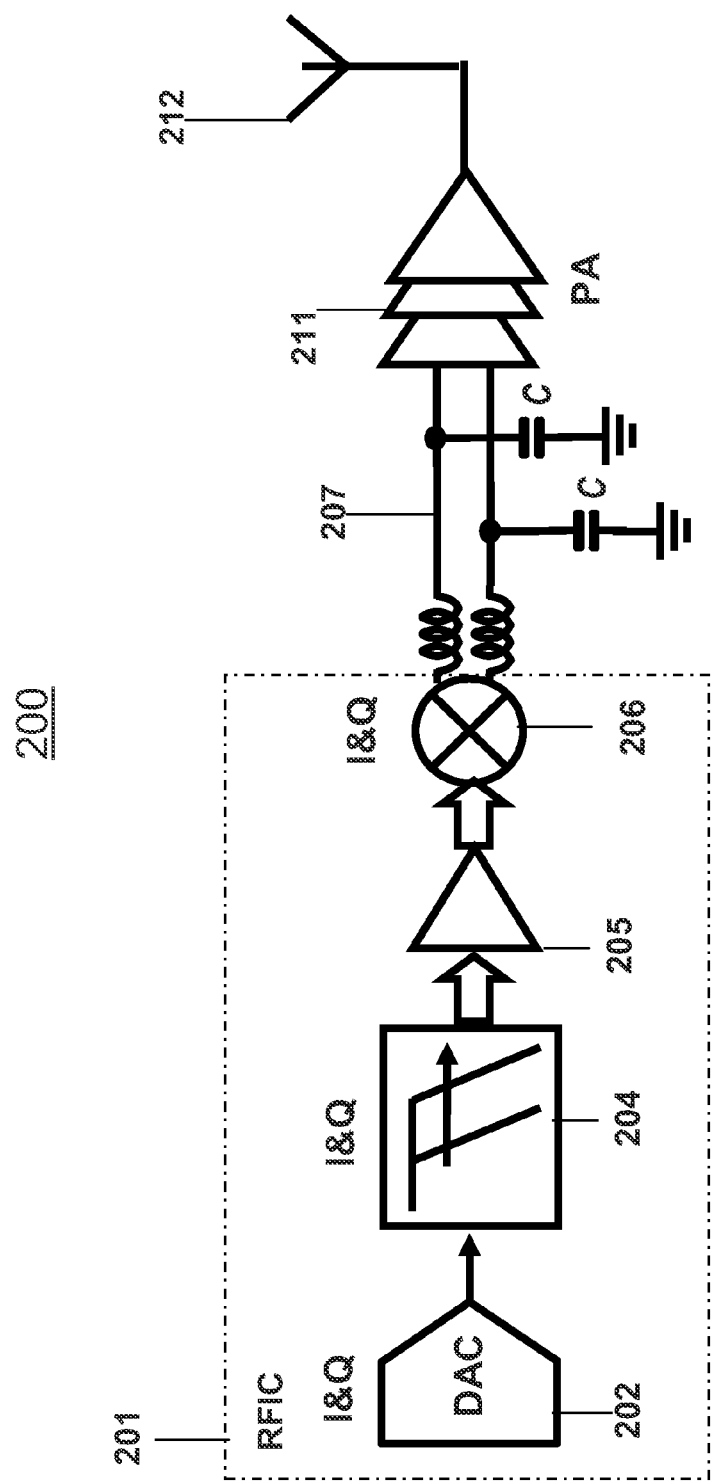
FIG. 2 illustrates an example of a transceiver front end utilizing a passive amplifier, according to some aspects of the subject technology.

FIG. 2 illustrates an example of transceiver front end 200, according to some aspects of the subject technology. In the example of FIG. 2, transceiver front end 200 includes RFIC 201 having DAC 202, filter 204, buffer 205 and mixer 206. Transceiver front end 200 further includes passive amplifier 207, power amplifier (PA) 211 and antenna 212. Depending on implementation, RFIC 202 may include a greater number (or fewer number) of the component parts of transceiver front end 200. Additionally, RFIC 202 may be implemented using different types of integrated circuits or chips, such as system-on-chip (SOC).

As illustrated, passive amplifier 207 is coupled between mixer 206 and PA 211. Power amplification is provided by (repartitioned) PA 211, that is coupled to RFIC 201 via passive amplifier 207. Although PA 211 is illustrated as having multiple stages of power amplification (e.g., three power amplification components), it is understood that PA 211 may include a greater (or lesser) number of power amplification stages, depending on implementation.

As will be describe in further detail below, the series resonance provided by passive amplifier 207 can eliminate the need for a power amplifier driver (such as PAD 108) and an off-chip interface (e.g., interface 109). In certain aspects, PA 211 can be implemented on one or more discrete components (e.g., chips or dies) that are separate from RFIC 201. For example, RFIC 201 may be implemented using SOC and configured to reside on a separate chip or die from that of PA 211 which is implemented using SOI. In other implementations, PA 211 may be integrated onto RFIC 201 and implemented using SOC. As noted above, although SOI is less efficient than GaAs (as is commonly used in off-chip power amplifier implementations, such as PA 110), the efficiency gained by eliminating the power amplifier driver (e.g., PAD 108) and off-chip interface (e.g., interface 109), can improve the overall efficiency of transceiver front end 200. Thus, the configuration of transceiver front end 200, which includes a repartitioned power amplifier (e.g., PA 211), can provide improved power efficiency with respect to the transceiver architecture described above with respect to FIG. 1.

Furthermore, the interface provided by passive amplifier 207 can provide linearity improvements, as compared to the architecture of RFIC 101, in which PAD 108 is coupled to off-chip PA 110 (implemented using GaAs), via interface 109. Thus, passive amplifier 207 can simplify the architecture of transceiver front end 200, while enabling a greater tolerance for capacitance at the input of PA 211. Additionally, coupling mixer 206 to PA 211, via passive amplifier 207, can help to attenuate certain harmonic components (e.g., LO $3^{rd}$ harmonic components) generated by mixer 206. Attenuation of some harmonic components can enable transceiver front end 200 to use the same PA (e.g. PA 211) for transmission of I and/or Q signals of different standards (e.g., 2G, 3G and 4G).

Figure 3:
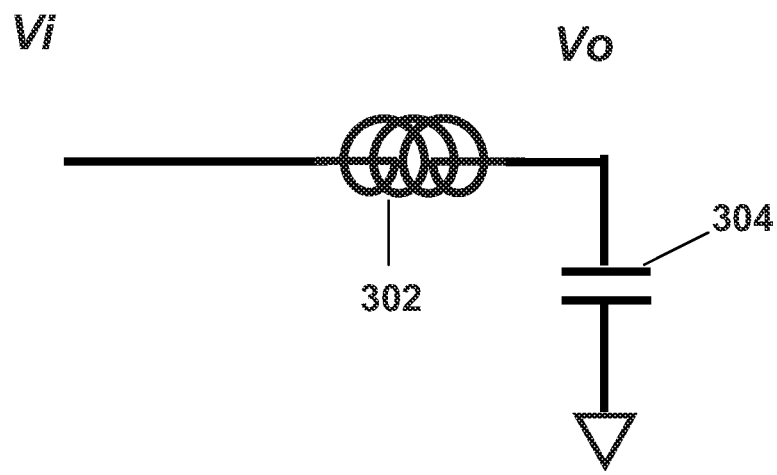
FIG. 3 illustrates an example of a passive amplifier that can be implemented in a transceiver front end, according to some aspects of the subject technology.

FIG. 3 illustrates an example of a passive amplifier 300 that can be implemented in a transceiver front end (e.g., transceiver front end 200), according to some aspects of the subject technology. By way of example, passive amplifier 300 may couple to a mixer (e.g., mixer 206) and a power amplifier (e.g., PA 211), as illustrated in the configuration of FIG. 2.

In the example illustrated, passive amplifier 300 is a series network, including inductor 302 and capacitor 304. Passive amplifier 300 includes an input path ($V_I$), and an output path ($V_O$) that is tapped between inductor 302 and capacitor 304. That is, output ($V_O$) can be coupled to a power amplifier (e.g. PA 211) as illustrated with respect to FIG. 2.

In the configuration of FIG. 3, passive amplifier 300 has an inductance given by:

$$Z_{IND}=r+j\omega L \qquad (1)$$

where r is the input resistance of the inductor modeling its loss, $\omega$ is the frequency of the RF signal propagated through passive amplifier 300 and L is the inductance of inductor 302.

Additionally, the capacitance of passive amplifier 300 can be represented by:

$$Z_{CAP}=1/j\omega C \qquad (2)$$

where C is the capacitance of capacitor 304.

Accordingly, the output of passive amplifier (e.g., $V_O$) can be given by:

$$V_O=V_I(Q)(-j) \qquad (3)$$

where Q represents a quality factor of inductor 302 and the gain (G) of passive amplifier 300 can be given by:

$$G=V_O/V_I \qquad (4)$$

When coupled to a mixer (e.g., mixer 206), passive amplifier 300 functions as a passive mixer load and reduces the overall impedance at the mixer output. Reduction of the mixer load can improve linearity of the mixer and can restore signal swing-back at $V_O$ by a factor of Q. Additionally, because frequency components of the mixer at higher order harmonics are filtered out (e.g., the $3^{rd}$ order and higher), linearity requirements of the PA can also be relaxed.

Figure 4:
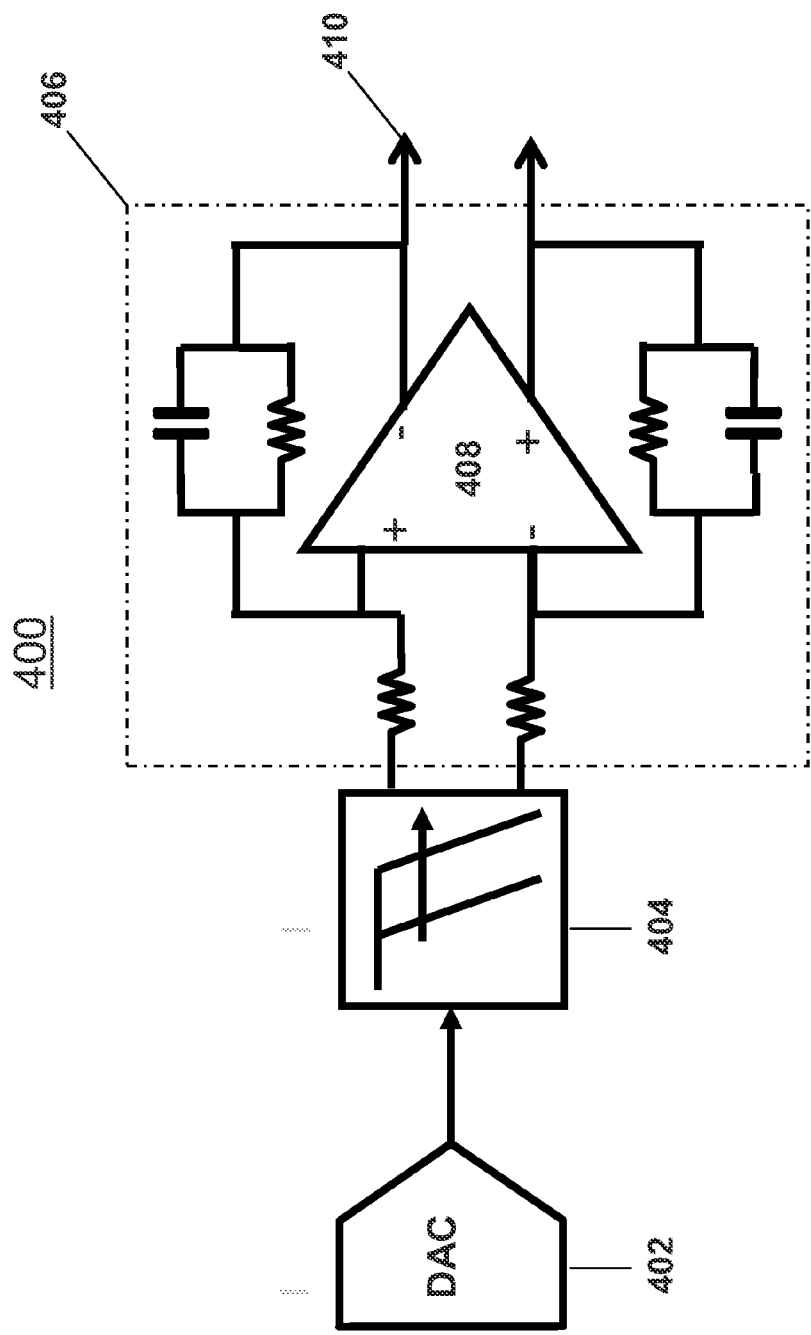
FIG. 4 illustrates an example of a transceiver front end utilizing an inverter based buffer, according to some aspects of the subject technology.

In certain implementations, a transceiver front end can include one or more inverter-based (baseband) buffers to further improve linearity and reduce overall power consumption. FIG. 4 illustrates an example of a portion of transceiver front end 400, utilizing an inverter based buffer 406, according to some aspects of the technology.

Transceiver front end 400 includes DAC 402, filter 404 and feedback buffer 406 with buffer output 410, wherein feedback buffer 406 includes inverter 408. As illustrated, DAC 402 is coupled to filter 404, which is coupled to an input of inverter based buffer 406. Buffer output 410 is configured to be coupled to the input of a passive mixer, as will be discussed below with respect to FIG. 6.

In certain, implementations, inverter 408 will be an inverter based feedback amplifier, configured to provide a current feedback. By using an inverter based buffer 406 to provide current feedback, gain consistency and linearity of transceiver front end 400 can be improved as compared systems implementing to non-feedback based buffers. Depending on implementation, inverter based buffer 406 may be implemented using PMOS and NMOS transistors, as illustrated in FIG. 5.

Figure 5:
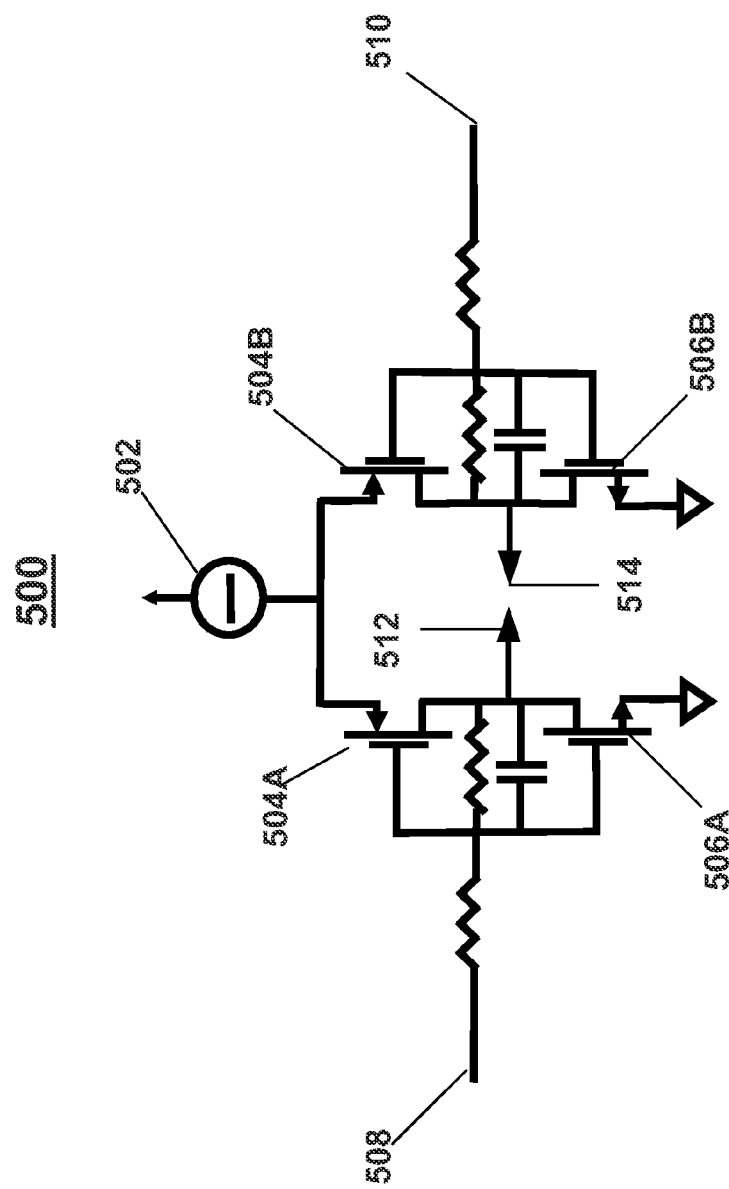
FIG. 5 conceptually illustrates an inverter based buffer, according to certain aspects of the subject technology.

Specifically, FIG. 5 conceptually illustrates inverter based buffer 500, according to certain aspects of the subject technology. Inverter based buffer 500 includes current source 502, PMOS transistors (504A and 504B), and NMOS transistors (506A and 506B). As illustrated, inverter based buffer 500 further includes differential inputs 508 and 510, and differential outputs 512 and 514. Differential inputs 508 and 510 can be coupled to the output of a low-pass filter, and differential outputs 512 and 514 can be coupled to the input of a passive mixer, for example, in the signal path of a transceiver front end as illustrated in FIG. 6.

Figure 6:
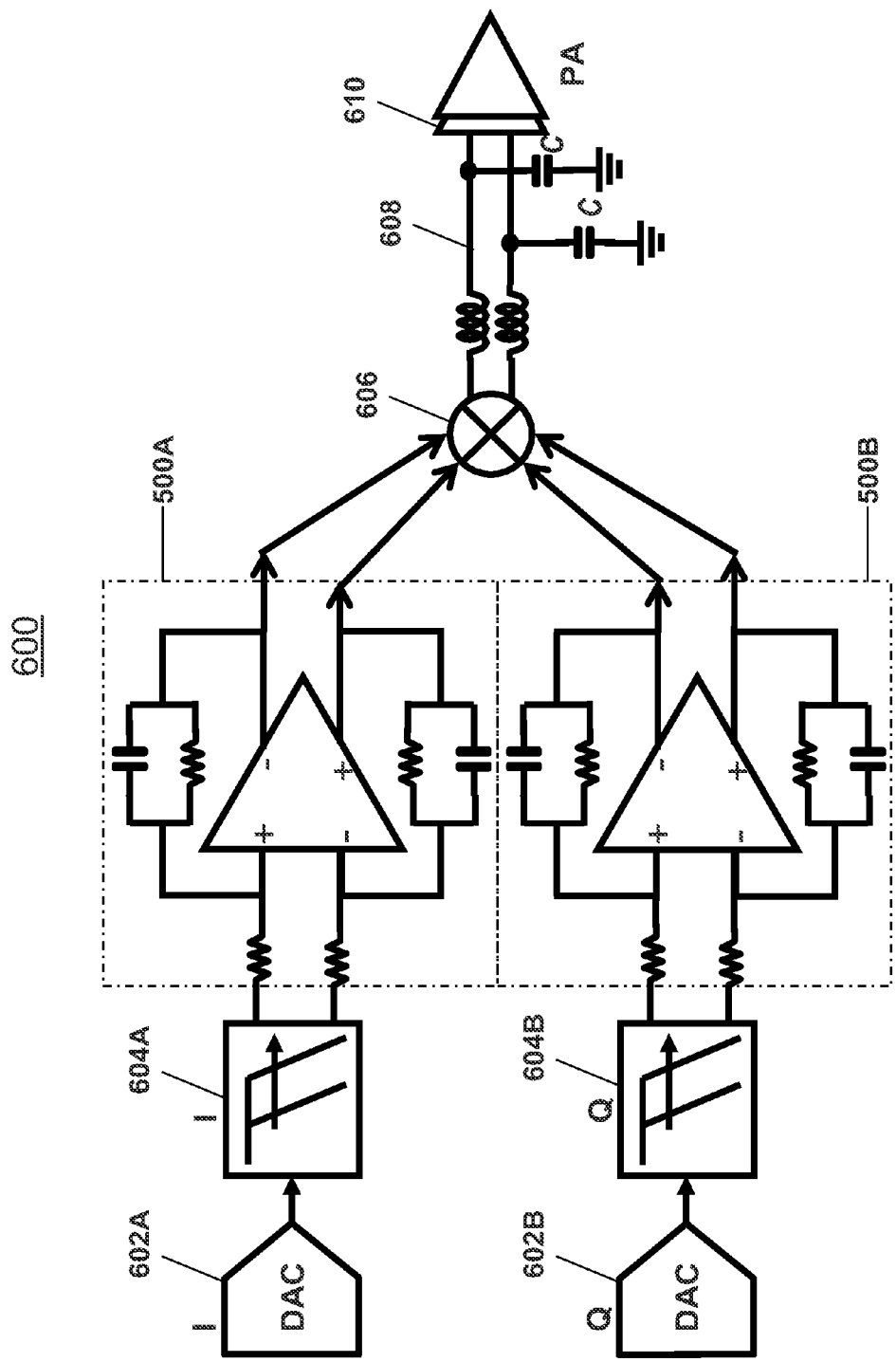
FIG. 6 illustrates an example of a transceiver front end including an inverter based buffer, according to certain aspects of the subject technology.

The schematic diagram of FIG. 6 illustrates an example of a transceiver front end 600 including inverter based buffers 500A and 500B. Specifically, FIG. 6 illustrates I and Q signal paths in transceiver front end 600, which include DACs (602A and 602B), filters (604A and 604B), inverter based buffers (500A and 500B), mixer 606, passive amplifier 608 and PA 610.

The outputs of filters (e.g., low-pass filters) 604A and 604B are provided to inverter based buffers 500A and 500B, respectively. In turn, outputs of inverter based buffers 500A and 500B are inputted into mixer 606, so that carried signals are modulated before being provided to PA 610, via passive amplifier 608. In some implementations, the components in transceiver front end 600 may be integrated onto a single die or chip and implemented using SOC. In other implementations, one or more portions of transceiver front end 600 may be implemented using SOI.

Figure 7:
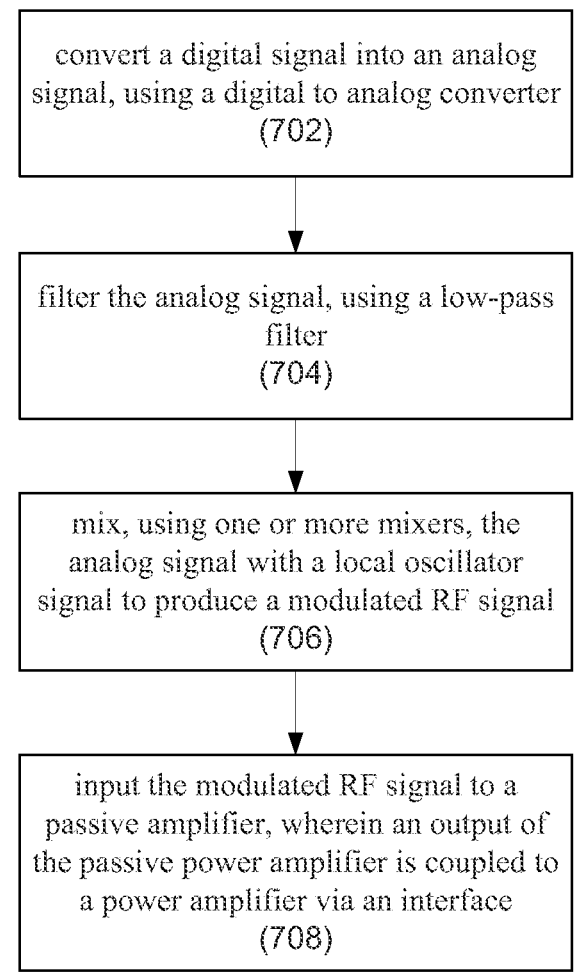
FIG. 7 illustrates an example process for amplifying a RF signal for transmission, according to certain aspects of the subject technology.

FIG. 7 illustrates an example process 700 for amplifying a RF signal for transmission, according to certain aspects of the subject technology. Process 700 begins when a digital signal is converted into an analog signal, for example, using a digital to analog converter (702). The analog signal can be filtered, using a filter (e.g., a low-pass filter), to remove high-frequency components (704).

The remaining low frequency components of the RF signal are then mixed (modulated), using one or more mixers (706). Although various types of modulation can be performed by the mixers, in certain aspects the RF signal will be mixed using LOI and/or LOQ signals (e.g., provided by a local clock) to perform mixing with respect to I and Q signal paths, respectively. The mixer output will provide the modulated RF signal to a passive amplifier, wherein an output of the passive power amplifier is coupled to a multi-stage active power amplifier via an interface (708).

Although various passive amplification circuits may be used to transmit a signal to a power amplification stage, in certain aspects the passive amplifier will include a series LC network, as discussed above with respect to FIG. 3.

It is understood that any specific order or hierarchy of steps in the processes disclosed is an illustration of example approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A transceiver circuit comprising:
   a digital-to-analog converter;
   a filter coupled to the digital-to-analog converter;
   a passive mixer on a system-on-chip (SOC) die, and coupled to the filter via a buffer; and
   a multi-stage power amplifier on a silicon-on-insulator (SOI) die, and coupled to the passive mixer via a passive amplifier, the passive amplifier comprising an inductor, the inductor coupled directly to an output of the passive mixer and directly to an input to the multi-stage power amplifier, the SOC die coupled to the SOI die via the passive amplifier.

2. The transceiver circuit of claim 1, wherein an output impedance of the passive mixer is less than 50 ohms.

3. The transceiver circuit of claim 1, wherein the passive amplifier comprises a series network, and wherein the series network comprises one or more inductors and one or more capacitors.

4. The transceiver circuit of claim 1, wherein the output of the passive amplifier is tapped between the inductor and a capacitor, and
  wherein the output of the passive amplifier is coupled to the input of the multi-stage power amplifier.

5. The transceiver circuit of claim 1, wherein the passive amplifier is configured to operate as a low-pass filter.

6. The transceiver circuit of claim 1, wherein the mixer is configured to modulate an in-phase signal.

7. The transceiver circuit of claim 1, wherein the mixer is configured to modulate a quadrature phase signal.

8. The transceiver circuit of claim 1, wherein an output of the multi-stage power amplifier is coupled to an antenna.

9. A transmitter, comprising:
  a digital-to-analog converter;
  a filter coupled to the digital-to-analog converter;
  a passive mixer on a system-on-chip (SOC) die, and coupled to the filter via a buffer, wherein the buffer comprises an inverter-based feedback amplifier; and
  a multi-stage power amplifier on a silicon-on-insulator (SOI) die, and coupled to the passive mixer via a passive amplifier, the passive amplifier comprising an inductor, the inductor coupled directly to an output of the passive mixer and directly to an input to the multi-stage power amplifier, the SOC die coupled to the SOI die via the passive amplifier.

10. The transmitter of claim 9, wherein an output impedance of the passive mixer is less than 50 ohms.

11. The transmitter of claim 9, wherein the passive amplifier comprises a series network, and wherein the series network comprises one or more inductors and one or more capacitors.

12. The transmitter of claim 9, wherein the output of the passive amplifier is tapped between the inductor and a capacitor, and
  wherein the output of the passive amplifier is coupled to the input of the multi-stage power amplifier.

13. The transmitter of claim 9, wherein the passive amplifier is configured to operate as a low-pass filter.

14. A method for amplifying a RF signal for transmission, comprising:
  converting a digital signal into an analog signal, using a digital to analog converter;
  filtering the analog signal, using a low-pass filter;
  mixing, using one or more mixers, the analog signal with a local oscillator signal to produce a modulated RF signal; and
  inputting the modulated RF signal to a passive amplifier, wherein an output of the passive amplifier is coupled to a multi-stage power amplifier via an interface, the passive amplifier comprising an inductor, the inductor coupled directly to the one or more mixers and directly to an input to the multi-stage power amplifier,
  the one or more mixers implemented on a system-on-chip (SOC) die and the multi-stage power amplifier implemented on a silicon-on-insulator (SOI) die, the SOC die coupled to the SOI die via the passive amplifier.

15. The method of claim 14, wherein the interface has an impedance of less than 50 ohms.

* * * * *